(12) United States Patent
Tanoue et al.

(10) Patent No.: US 12,191,149 B2
(45) Date of Patent: Jan. 7, 2025

(54) SUBSTRATE PROCESSING METHOD AND SUBSTRATE PROCESSING SYSTEM

(71) Applicant: Tokyo Electron Limited, Tokyo (JP)

(72) Inventors: Hayato Tanoue, Kumamoto (JP); Yohei Yamashita, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 302 days.

(21) Appl. No.: 17/772,163

(22) PCT Filed: Sep. 11, 2020

(86) PCT No.: PCT/JP2020/034427
§ 371 (c)(1),
(2) Date: Apr. 27, 2022

(87) PCT Pub. No.: WO2021/084934
PCT Pub. Date: May 6, 2021

(65) Prior Publication Data
US 2022/0406602 A1 Dec. 22, 2022

(30) Foreign Application Priority Data

Oct. 28, 2019 (JP) ................................. 2019-195287

(51) Int. Cl.
*B23K 26/53* (2014.01)
*B24B 7/22* (2006.01)
(Continued)

(52) U.S. Cl.
CPC ............ *H01L 21/268* (2013.01); *B23K 26/53* (2015.10); *B24B 7/228* (2013.01); *H01L 21/304* (2013.01); *B23K 2103/56* (2018.08)

(58) Field of Classification Search
CPC ....................... B23K 26/0093; B23K 26/0823; B23K 26/36; B23K 26/362; B23K 26/40;
(Continued)

(56) References Cited

U.S. PATENT DOCUMENTS

| 2015/0140785 A1 | 5/2015 | Kwak |
| 2021/0039203 A1 | 2/2021 | Tanoue |

(Continued)

FOREIGN PATENT DOCUMENTS

| JP | H9-216152 A | 8/1997 |
| JP | 2004111606 A | 4/2004 |

(Continued)

OTHER PUBLICATIONS

International Search Report of PCT/JP2020/034427 dated Oct. 13, 2020.

(Continued)

*Primary Examiner* — Michael A Tolin
(74) *Attorney, Agent, or Firm* — Shih IP Law Group, PLLC.

(57) ABSTRACT

A substrate processing method of processing a combined substrate in which a first substrate and a second substrate are bonded to each other includes forming a peripheral modification layer along a boundary between a peripheral portion of the first substrate as a removing target and a central portion of the first substrate; forming a non-bonding region in which bonding strength between the first substrate and the second substrate in the peripheral portion is reduced; and removing the peripheral portion starting from the peripheral modification layer. A first crack is developed from the peripheral modification layer toward the second substrate. The peripheral modification layer is formed such that a lower end of the first crack is located above the non-bonding region and an inner end of the non-bonding region is located at a diametrically outer side than the first crack.

20 Claims, 6 Drawing Sheets

(51) Int. Cl.
*H01L 21/268* (2006.01)
*H01L 21/304* (2006.01)
*B23K 103/00* (2006.01)

(58) Field of Classification Search
CPC .......................... B23K 26/53; B23K 2101/40; B23K 2103/50; B23K 2103/56; B24B 1/00; B24B 7/04; B24B 7/228; B28D 5/00; H01L 21/185; H01L 21/268; H01L 21/304; H01L 21/67092
See application file for complete search history.

(56) References Cited

U.S. PATENT DOCUMENTS

| | | | | |
|---|---|---|---|---|
| 2022/0250190 A1* | 8/2022 | Tanoue | ................ | B23K 26/083 |
| 2022/0250191 A1* | 8/2022 | Tanoue | ................ | B23K 26/53 |
| 2023/0178374 A1* | 6/2023 | Tanoue | ................ | H01L 21/268 |
| | | | | 438/795 |
| 2023/0207344 A1* | 6/2023 | Yamawaki | ............ | H01L 21/304 |
| | | | | 438/462 |

FOREIGN PATENT DOCUMENTS

| | | |
|---|---|---|
| JP | 2006-108532 A | 4/2006 |
| JP | 2009131942 A | 6/2009 |
| JP | 2009135342 A | 6/2009 |
| JP | 2011159798 A | 8/2011 |
| JP | 2012064667 A | 3/2012 |
| JP | 2013-149804 A | 8/2013 |
| JP | 2014167966 A | 9/2014 |
| JP | 2017-071074 A | 4/2017 |
| JP | 2017191825 A | 10/2017 |
| WO | 2019176589 A1 | 9/2019 |

OTHER PUBLICATIONS

International Search Report of PCT/JP2019/008120 dated May 28, 2019.

* cited by examiner

SUBSTRATE PROCESSING METHOD AND SUBSTRATE PROCESSING SYSTEM

CROSS-REFERENCE TO RELATED APPLICATIONS

This Application is a U.S. national phase application under 35 U.S.C. § 371 of PCT Application No. PCT/JP2020/034427 filed on Sep. 11, 2020, which claims the benefit of Japanese Patent Application No. 2019-195287 filed on Oct. 28, 2019, the entire disclosures of which are incorporated herein by reference.

TECHNICAL FIELD

The various aspects and embodiments described herein pertain generally to a substrate processing method and a substrate processing system.

BACKGROUND

Patent Document 1 describes a grinding method for a wafer including a process of removing an outer periphery of the wafer by radiating a laser beam along an edge of the wafer at an inner position than the edge on a surface side of the wafer and a process of grinding, to a predetermined finishing thickness, a grinding target surface of the wafer from which the outer periphery has been removed.

PRIOR ART DOCUMENT

Patent Document 1: Japanese Patent Laid-open Publication No. 2006-108532

DISCLOSURE OF THE INVENTION

Means for Solving the Problems

In an exemplary embodiment, a substrate processing method of processing a combined substrate in which a first substrate and a second substrate are bonded to each other includes forming a peripheral modification layer along a boundary between a peripheral portion of the first substrate as a removing target and a central portion of the first substrate; forming a non-bonding region in which bonding strength between the first substrate and the second substrate in the peripheral portion is reduced; and removing the peripheral portion starting from the peripheral modification layer. A first crack is developed from the peripheral modification layer toward the second substrate. The peripheral modification layer is formed such that a lower end of the first crack is located above the non-bonding region and an inner end of the non-bonding region is located at a diametrically outer side than the first crack.

DETAILED DESCRIPTION

Recently, in a manufacturing process for a semiconductor device, in a combined substrate in which substrates are bonded to each other, a semiconductor substrate (hereinafter, referred to as "wafer") having a plurality of devices such as electronic circuits formed on a front surface thereof is thinned by grinding a rear surface of the wafer.

Typically, a peripheral portion of the wafer is chamfered. If, however, the grinding processing is performed on the wafer as stated above, the peripheral portion of the wafer is given a sharp pointed shape (a so-called knife edge shape). If so, chipping takes place at the peripheral portion of the wafer, and the wafer may be damaged. Thus, there is performed so-called edge trimming of removing the peripheral portion of the wafer prior to the grinding processing.

The grinding method described in the aforementioned Patent Document 1 is a method of suppressing this knife edge shape from being formed at the peripheral portion of the wafer (first wafer). When performing the edge trimming (removing of the peripheral portion) of the first wafer bonded to a second wafer by the method disclosed in Patent Document 1, the peripheral portion may not be removed appropriately as this peripheral portion is bonded to the second wafer. Specifically, a part of the peripheral portion may remain without being appropriately peeled from the first wafer, resulting in formation of a flaw on a rear surface of the first wafer or breakdown of an apparatus. Thus, there is still a room for improvement in the conventional edge trimming.

In view of the foregoing, the present disclosure provides a technique enabling to remove the peripheral portion of the first substrate appropriately in the combined substrate in which the substrates are bonded to each other. Hereinafter, a wafer processing system as a substrate processing system and a wafer processing method as a substrate processing method according to an exemplary embodiment will be described with reference to the accompanying drawings. In the present specification and drawings, parts having substantially the same functions and configurations will be assigned same reference numerals, and redundant description thereof will be omitted.

Figure 1A:
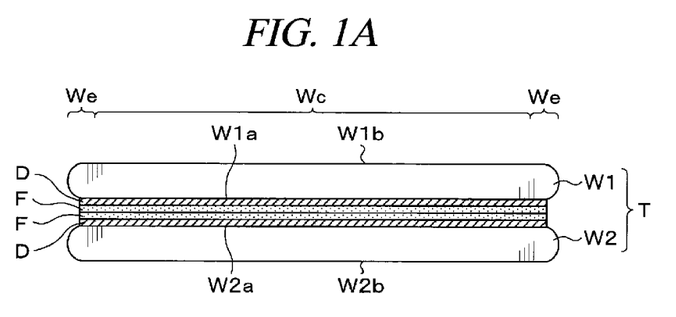
FIG. 1A and FIG. 1B are explanatory diagrams illustrating a structure of a combined wafer to be processed in a wafer processing system.

A wafer processing system 1 to be described later according to the present exemplary embodiment performs a processing on a combined wafer T as a combined substrate in which a first wafer W1 as a first substrate and a second wafer W2 as a second substrate are bonded to each other, as shown in FIG. 1A. In the wafer processing system 1, the first wafer W1 is thinned while removing a peripheral portion We of the first wafer W1. Hereinafter, in the first wafer W1, a surface boned to the second wafer W2 will be referred to as a front surface W1a, and a surface opposite to the front surface W1a will be referred to as a rear surface W1b. Likewise, in the second wafer W2, a surface bonded to the first wafer W1 will be referred to as a front surface W2a, and a surface opposite to the front surface W2a will be referred to as a rear surface W2b.

The first wafer W1 is a semiconductor wafer such as, but not limited to, a silicon wafer, and it has, on the front surface W1a thereof, a device layer D including a plurality of devices. A surface film F is further formed on the device layer D, and the device layer D is bonded to the second wafer W2 with the surface film F therebetween. The surface film F may be, by way of non-limiting example, an oxide film (a $SiO_2$ film or a TEOS film), a SiC film, a SiCN film, or an adhesive agent. Moreover, a peripheral portion We of the first wafer W1 is chamfered, and a thickness of the peripheral portion We decreases as it goes toward a leading end thereof on a cross section thereof. Here, the peripheral portion We is a portion to be removed in edge trimming to be described later, and is in a range from, e.g., 0.5 mm to 3 mm from an edge of the first wafer W1 in a diametrical direction thereof.

The second wafer W2 has the same structure as the first wafer W1, for example. A device layer D and a surface film F are formed on the front surface W2a of the second wafer W2, and a peripheral portion thereof is chamfered. Here, however, the second wafer W2 does not need to be a device wafer on which the device layer D is formed. By way of example, the second wafer W2 may be a support wafer which supports the first wafer W1. In this case, the second wafer W2 functions as a protection member for protecting the device layer D on the front surface W1a of the first wafer W1.

Figure 5A:
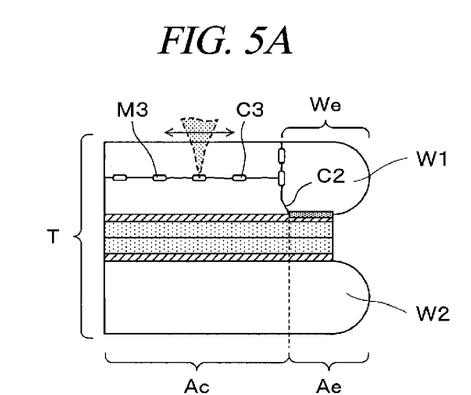
FIG. 5A to FIG. 5D are explanatory diagrams illustrating the example of the main processes of the wafer processing.
Figure 5B:
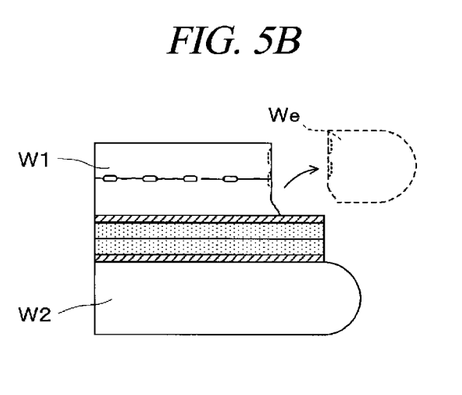
Figure 5C:
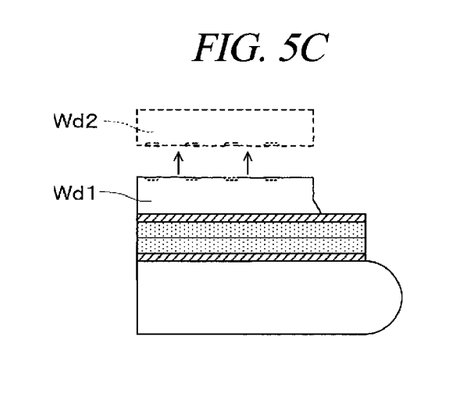

Further, in the wafer processing system 1 of the present exemplary embodiment, the first wafer W1 in the combined wafer T is thinned by being separated into a front surface W1a side and a rear surface W1b side, as shown in FIG. 5C to be described later. In the following description, the separated first wafer W1 on the front surface W1a side will be referred to as a first separation wafer Wd1, and the separated first wafer W1 on the rear surface W1b side will be referred to as a second separation wafer Wd2. The first separation wafer Wd1 has the device layer D and is produced as a product. The second separation wafer Wd2 is reused. Further, the first separation wafer Wd1 may refer to the first wafer W1 bonded to the second wafer W2, and may sometimes be used as a term including the second wafer W2. In addition, separated surfaces of the first separation wafer Wd1 and the second separation wafer Wd2 are sometimes referred to as separation surfaces.

Figure 2:
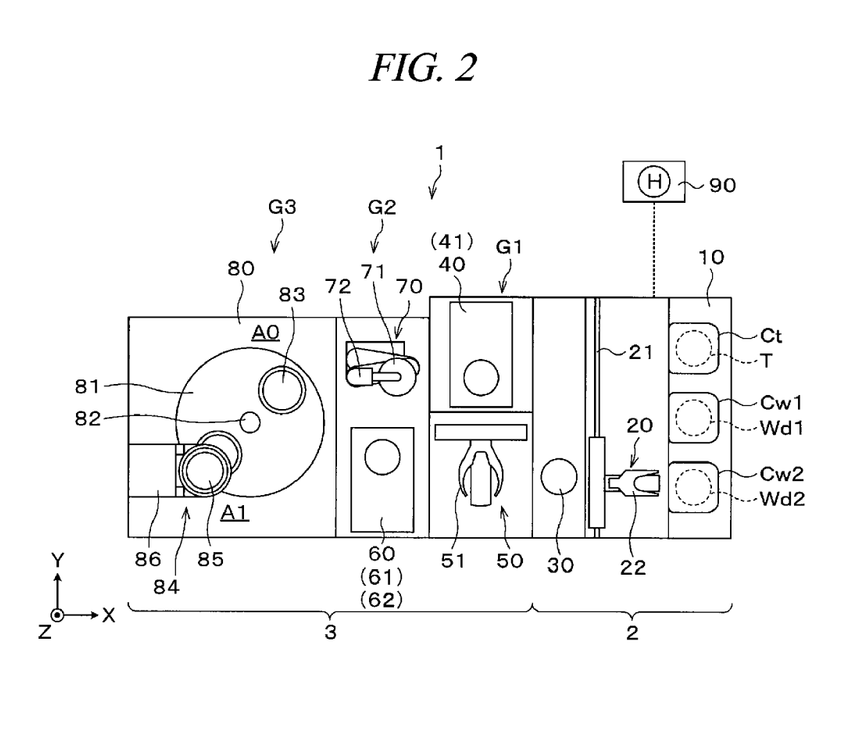
FIG. 2 is a plan view schematically illustrating a configuration example of the wafer processing system.

As depicted in FIG. 2, the wafer processing system 1 has a configuration in which a carry-in/out station 2 and a processing station 3 are connected as one body. In the carry-in/out station 2, cassettes Ct, Cw1, and Cw2 respectively capable of accommodating therein a plurality of combined wafers T, a plurality of first separation wafers Wd1, and a plurality of second separation wafers Wd2 are carried to/from the outside, for example. The processing station 3 is equipped with various kinds of processing apparatuses configured to perform required processings on the combined wafer T.

Further, in the present exemplary embodiment, although the cassette Ct and the cassette Cw1 are separately provided, they may be shared. That is, a cassette for accommodating the combined wafers T before being processed and a cassette for accommodating the first separation wafers Wd1 after being processed may be one and the same cassette.

A cassette placing table 10 is provided in the carry-in/out station 2. In the shown example, a plurality of, e.g., three cassettes Ct, Cw1 and Cw2 may be arranged on the cassette placing table 10 in a row in the Y-axis direction. Further, the number of the cassettes Ct, Cw1 and Cw2 placed on the cassette placing table 10 is not limited to the example of the present exemplary embodiment but may be selected as required.

In the carry-in/out station 2, a wafer transfer device 20 is provided adjacent to the cassette placing table 10 on the negative X-axis side of the cassette placing table 10. The wafer transfer device 20 is configured to be movable on a transfer path 21 extending in the Y-axis direction. The wafer transfer device 20 is equipped with, for example, two transfer arms 22 each of which is configured to hold and transfer the combined wafer T. Each transfer arm 22 is configured to be movable in a horizontal direction and a vertical direction and pivotable around a horizontal axis and a vertical axis. Further, the configuration of the transfer arm 22 is not limited to the present exemplary embodiment, and various other configurations may be adopted. The wafer transfer device 20 is configured to be capable of transferring the combine wafer T to/from the cassettes Ct, Cw1 and Cw2 of the cassette placing table 10 and a transition device 30 to be described later.

In the carry-in/out station 2, the transition device 30 configured to deliver the combined wafer T is provided adjacent to the wafer transfer device 20 on the negative X-axis side of the wafer transfer device 20.

The processing station 3 is provided with, for example, three processing blocks G1 to G3. The first processing block G1, the second processing block G2 and the third processing block G3 are arranged side by side in this sequence from the positive X-axis side (the carry-in/out station 2 side) toward the negative X-axis side.

The first processing block G1 is equipped with an etching apparatus 40, a cleaning apparatus 41, and a wafer transfer device 50. The etching apparatus 40 and the cleaning apparatus 41 are stacked on top of each other. Further, the number and the layout of the etching apparatus 40 and the cleaning apparatus 41 are not limited to the shown example. By way of example, the etching apparatus 40 and the cleaning apparatus 41 may be arranged side by side in the X-axis direction. Furthermore, a plurality of etching apparatuses 40 and a plurality of cleaning apparatuses 41 may be respectively stacked on top of each other.

The etching apparatus 40 is configured to etch a ground surface of the first wafer W1 ground by a processing apparatus 80 to be described later. For example, by supplying a chemical liquid (etching liquid) onto the ground surface, the ground surface is wet-etched. By way of non-limiting example, HF, $HNO_3$, $H_3PO_4$, TMAH, Choline, KOH, or the like may be used as the chemical liquid.

The cleaning apparatus 41 is configured to clean the ground surface of the first wafer W1 ground by the processing apparatus 80 to be described later. For example, by bringing a brush into contact with the ground surface, the ground surface is cleaned by being scrubbed. Furthermore, a pressurized cleaning liquid may be used for the cleaning of the ground surface. Moreover, the cleaning apparatus 41 may be configured to clean the rear surface W2b of the second wafer W2 as well as the ground surface of the first wafer W1.

The wafer transfer device 50 is disposed on the negative Y-axis side of the etching apparatus 40 and the cleaning apparatus 41, for example. The wafer transfer device 50 is equipped with, for example, two transfer arms 51 each of which is configured to hold and transfer the combined wafer T. Each transfer arm 51 is configured to be movable in a horizontal direction and a vertical direction and pivotable about a horizontal axis and a vertical axis. Further, the configuration of the transfer arm 51 is not limited to the exemplary embodiment, and various other configurations may be adopted. Additionally, the wafer transfer device 50 is configured to be capable of transferring the combined wafer T to/from the transition device 30, the etching apparatus 40, the cleaning apparatus 41, an interface modifying apparatus 60 to be described later, an internal modifying apparatus 61 to be described later, and a periphery removing apparatus 62 to be described later.

The second processing block G2 is equipped with the interface modifying apparatus 60 as a second modifying unit, the internal modifying apparatus 61 as a first modifying unit and a third modifying unit, the periphery removing apparatus 62 as a removing unit, and a wafer transfer device 70. The interface modifying apparatus 60, the internal modifying apparatus 61, and the periphery removing apparatus 62 are stacked on top of each other. The number and the layout of the interface modifying apparatus 60, the internal modifying apparatus 61 and the periphery removing apparatus 62 are not limited to the example of the present exemplary embodiment. For example, the interface modifying apparatus 60, the internal modifying apparatus 61 and the periphery removing apparatus 62 may be arranged side by side in the X-axis direction. Furthermore, a plurality of interface modifying apparatuses 60, a plurality of internal modifying apparatuses 61, and a plurality of periphery removing apparatuses 62 may be respectively stacked.

The interface modifying apparatus 60 radiates laser light (laser light for interface for example, $CO_2$ laser) to, for example, an outer periphery of the device layer D of the first wafer W1 to modify the outer periphery of the device layer D. More specifically, an interface between the first wafer W1 and the device layer D in the peripheral portion We of the first wafer W1 as a removing target is modified. Accordingly, a non-bonding region Ae where bonding strength between the first wafer W1 and the second wafer W2 is reduced is formed in the peripheral portion We of the first wafer W1.

The internal modifying apparatus 61 radiates laser light (laser light for inside, for example, YAG laser) to the inside of the first wafer W1 to form a peripheral modification layer M1, a split modification layer M2, and an internal modification layer M3. The peripheral modification layer M1 serves as a starting point when the peripheral portion We is removed in the edge trimming to be described later. The split modification layer M2 serves as a starting point when the peripheral portion We to be removed is broken into smaller pieces. The internal modification layer M3 serves as a starting point when the first wafer W1 is separated into the first separation wafer Wd1 and the second separation wafer Wd2.

The periphery removing apparatus 62 removes the peripheral portion We of the first wafer W1 starting from the peripheral modification layer M1 and the split modification layer M2 formed in the internal modifying apparatus 61, that is, performs the edge trimming. A specific way to perform the edge trimming can be selected as required.

The wafer transfer device 70 is disposed on the positive Y-axis side of the interface modifying apparatus 60, the internal modifying apparatus 61, and the periphery removing apparatus 62, for example. The wafer transfer device 70 has, for example, two transfer arms 71 each of which is configured to attract and hold the combined wafer T on a non-illustrated attracting/holding surface thereof to carry the combined wafer T. Each transfer arm 71 is supported by a multi-joint arm member 72, and is configured to be movable in a horizontal direction and a vertical direction and pivotable about a horizontal axis and a vertical axis. In addition, the configuration of the transfer arm 71 is not limited to the present exemplary embodiment, and any of various configurations may be adopted. Additionally, the wafer transfer device 70 is configured to be capable of transferring the combined wafer T to/from the etching apparatus 40, the cleaning apparatus 41, the interface modifying apparatus 60, the internal modifying apparatus 61, the peripheral removing apparatus 62, and the processing apparatus 80 to be described later.

The third processing block G3 is equipped with the processing apparatus 80. The number and the layout of the processing apparatus 80 is not limited to the example of the present exemplary embodiment, and a plurality of processing apparatuses 80 may be arranged as required.

The processing apparatus 80 has a rotary table 81. The rotary table 81 is configured to be rotatable around a vertical rotation center line 82 by a rotation mechanism (not shown). Two chucks 83 each configured to attract and hold the combined wafer T are provided on the rotary table 81. The chucks 83 are arranged on a circle concentric with the rotary table 81 in a uniform manner. The two chucks 83 are configured to be moved to a delivery position A0 and a processing position A1 as the rotary table 81 is rotated. Further, each of the two chucks 83 is configured to be rotatable around a vertical axis by a rotating mechanism (not shown).

At the delivery position A0, delivery of the combined wafer T is performed. A grinding unit 84 is disposed at the processing position A1 to grind the first wafer W1. The grinding unit 84 is equipped with a grinder 85 having a grinding whetstone (not shown) configured to be rotated in a ring shape. Further, the grinder 85 is configured to be movable in a vertical direction along a supporting column 86. While keeping the combined wafer T held by the chuck 83 in contact with the grinding whetstone, the chuck 83 and the grinding whetstone are respectively rotated.

The above-described wafer processing system 1 is equipped with a control device 90. The control device 90 is, for example, a computer, and includes a program storage (not shown). A program for controlling a processing of the combined wafer T in the wafer processing system 1 is stored in the program storage. Further, the program storage also stores therein a program for implementing a wafer processing to be described later in the wafer processing system 1 by controlling operations of the above-described various processing apparatuses and a driving system such as the transfer devices. In addition, the programs may be recorded in a computer-readable recording medium H, and may be installed from this recording medium H to the control device 90.

Now, a wafer processing performed by using the wafer processing system 1 configured as described above will be explained. In the present exemplary embodiment, the first wafer W1 and the second wafer W2 are bonded to each other to form the combined wafer T in advance in a bonding apparatus (not shown) outside the wafer processing system 1.

Figure 4A:
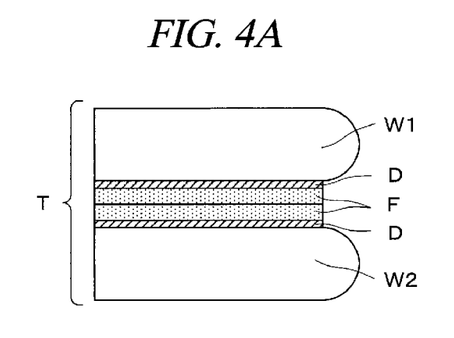
FIG. 4A to FIG. 4D are explanatory diagrams illustrating the example of the main processes of the wafer processing.

First, the cassette Ct accommodating therein a plurality of combined wafers T as shown in FIG. 4A is placed on the cassette placing table 10 of the carry-in/out station 2.

Then, the combined wafer T in the cassette Ct is taken out by the wafer transfer device 20 and transferred to the transition device 30.

Subsequently, the combined wafer T in the transition device 30 is taken out by the wafer transfer device 50 and transferred to the interface modifying apparatus 60. In the interface modifying apparatus 60, laser light is radiated to the interface between the first wafer W1 and the device layer D to modify the interface, as shown in FIG. 4B (process S1 of FIG. 3).

If the interface between the first wafer W1 and the device layer D is modified in the process S1, the bonding strength between the first wafer W1 and the second wafer W2 is reduced. As a result, at the interface between the first wafer W1 and the device layer D, a bonding region Ac in which the first wafer W1 and the second wafer W2 are bonded and the non-bonding region Ae in which the bonding strength is reduced at a diametrically outer side than the bonding region Ac are formed. In the edge trimming to be described later, when the peripheral portion We of the first wafer W1 as the removing target is removed, the peripheral portion We can be appropriately removed (peeled) due to the presence of the non-bonding region Ae.

Moreover, in the formation of the non-bonding region Ae, the laser light is radiated while rotating the combined wafer T (first wafer W1) about a central axis thereof as a rotation axis. As a result, the non-bonding region Ae is formed to be concentric with the combined wafer T (the first wafer W1). In addition, an inner end portion of the non-bonding region Ae in the diametrical direction (hereinafter, referred to as "inner end") is located at a slightly outer side in the diametrical direction than an inner end of the peripheral portion We to be actually removed, that is, a position where the peripheral modification layer M1 is formed in the internal modifying apparatus 61 to be described later.

In addition, although the non-bonding region Ae is formed at the interface between the first wafer W1 and the device layer D in the shown example, the position where the non-bonding region Ae is formed is not limited thereto as long as it is provided inside the combined wafer T and the bonding strength between the first wafer W1 and the second wafer W2 can be reduced. For example, the non-bonding region Ae may be formed at an interface between the second wafer W2 and the device layer D, or at an interface between the surface films F of the first wafer W1 and the second wafer W2 that are actually bonded.

Further, when the non-bonding region Ae is formed at, for example, the interface between the second wafer W2 and the device layer D, it may be formed by radiating the laser light from above the inverted combined wafer T, that is, from the second wafer W2 side.

Here, in order to effectively accelerate the removal of the peripheral portion We along the non-bonding region Ae in the subsequent edge trimming, it is desirable that the wavelength of the laser light for interface has a wavelength band ranging from 8.9 μm to 11 μm. Specifically, when the surface film F is made of, for example, a $SiO_2$ film, it is known that an asymmetric stretching peak having the largest absorption coefficient absorbs light most efficiently. In order to absorb the light at this asymmetric stretching peak, it is desirable that the wavelength of the laser light ranges between 8.9 μm and 11 μm.

The $CO_2$ laser used as the laser light for interface in the present exemplary embodiment has many oscillation lines in the wavelength band of 8.9 μm to 11 μm. That is, in order to form the non-bonding region Ae at the surface film F made of the $SiO_2$ film, it is desirable to use the $CO_2$ laser as the laser light for interface, and it is more desirable to use $CO_2$ laser light having a wavelength of about 9.3 μm.

The combined wafer T having the non-bonding region Ae formed therein is then transferred to the internal modifying apparatus 61 by the wafer transfer device 70. In the internal modifying apparatus 61, the peripheral modification layer M1 and the split modification layer M2 are sequentially formed inside the first wafer W1 (process S2 of FIG. 3), as shown in FIG. 4C, and the internal modification layer M3 is formed (process S3 of FIG. 3), as illustrated in FIG. 5A.

Figure 4B:
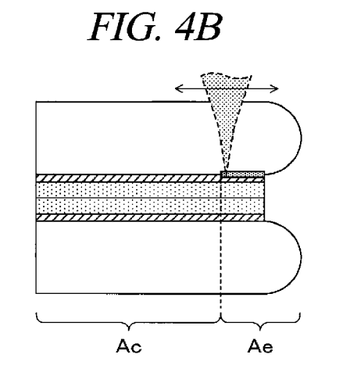
Figure 4C:
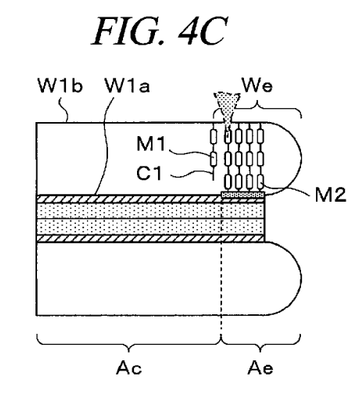

Further, in the drawings after FIG. 4C, illustration of the split modification layer M2 is omitted to avoid complication of the illustration.

In the formation of the peripheral modification layer M1, while rotating the combined wafer T (the first wafer W1), the laser light is periodically radiated to the inside of the first wafer W1 from a laser head (not shown). As a result, the peripheral modification layer M1 is formed in an annular shape to be concentric with the bonding region Ac (non-bonding region Ae). Here, the number of the peripheral modification layer M1 formed in a thickness direction of the first wafer W1 is not limited to the shown example but may be selected as required.

Here, the peripheral modification layer M1 is formed at a slightly inner side than the inner end of the non-bonding region Ae in the diametrical direction, as stated above. Although it is ideal that the peripheral modification layer M1 is formed at a position overlapping a boundary between the bonding region Ac and the non-bonding region Ae (hereinafter, simply referred to as "boundary"), the peripheral modification layer M1 may sometimes be formed while being deviated from the boundary due to, for example, a processing error or the like. If the peripheral modification layer M1 is formed at a position deviated from the boundary in the diametrically outward direction, that is, formed in the non-bonding region Ae, the first wafer W1 may not be firmly bonded to the second wafer W2 after the peripheral portion We is removed. If the first wafer W1 is in this state where it is not firmly bonded, the edge of the first wafer W1 may be broken in a subsequent process of the wafer processing or a wafer transfer, resulting in contamination.

As a resolution, by controlling the peripheral modification layer M1 to be formed at the inner side than the boundary in the diametrical direction as illustrated in FIG. 4C, it is possible to form the peripheral modification layer M1 at a position overlapping the boundary or at a position slightly inner than the boundary in the diametrical direction but still close to the boundary even when the position of the peripheral modification layer M1 is deviated from the boundary due to the processing error or the like. Therefore, the formation of the peripheral modification layer M1 at a position apart from the boundary in a diametrically outward direction can be suppressed.

In addition, within the first wafer W1, a crack C1 as a first crack develops from the peripheral modification layer M1 in the thickness direction (hereinafter, sometimes referred to as "up-down direction", and the rear surface W1b side and the front surface W1a side of the first wafer W1 will be respectively referred to as "upwards" and "downwards"). The crack C1 developing upwards from the peripheral modification layer M1 reaches, for example, the rear surface W1b of the first wafer W1. Meanwhile, the crack C1 developing downwards does not reach the front surface W1a of the first wafer W1. To elaborate, the development of the crack C1 is controlled so that a lower end of the crack C1 is positioned at least above the inner end of the non-bonding region Ae. The development of the crack C1 is controlled by adjusting, for example, the formation position of the peripheral modification layer M1 in the thickness direction of the first wafer W1, or by adjusting, for example, an output or a blurred state of the laser light during the formation of the peripheral modification layer M1.

Figure 6:
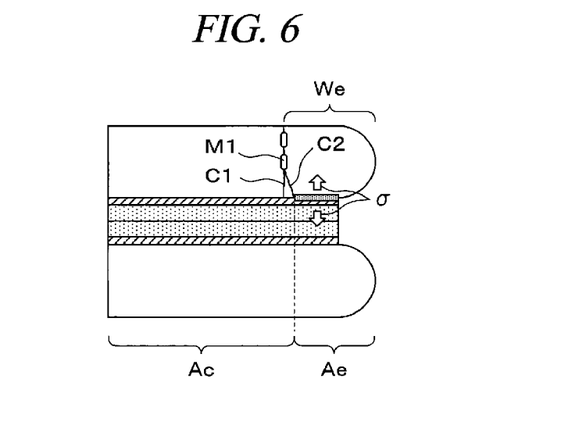
FIG. 6 is an explanatory diagram for describing an influence of a stress generated in a first wafer.

For example, when the crack C1 extends up to a position below the inner end of the non-bonding region Ae, the peripheral portion We may not be properly removed. Specifically, in the formation of the non-bonding region Ae, ablation occurs when the laser is radiated to the interface, and an internal stress a is accumulated in the portion where the non-bonding region Ae is formed. In an outer periphery of the first wafer W1 in which the non-bonding region Ae is formed, a force in a peeling direction (up-down direction) acts due to this internal stress a. For this reason, in the outer periphery of the first wafer W1, a crack C2 may develop obliquely upwards from the inner end of the non-bonding region Ae separately from the crack C1, as illustrated in FIG. 6. The inventors of the present application have found out that if the crack C1 and the crack C2 are not connected in this way or if the crack C1 reaches the front surface W1a of the first wafer W1, the peeling may not be stable in the removal of the peripheral portion We, and a part of the peripheral portion We may be removed starting from the crack C1 while a part of the peripheral portion We may be removed starting from the crack C2, resulting in a non-uniform peeled surface of the peripheral portion We over the entire circumference thereof.

Figure 4D:
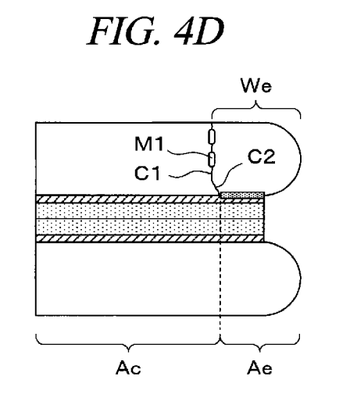

According to the present exemplary embodiment, however, since the lower end of the crack C1 is located at least above the inner end of the non-bonding region Ae and, also, since the inner end of the non-bonding region Ae is located at the outer side than the peripheral modification layer M1 in the diametrical direction, the crack C2 developing obliquely upwards from the inner end of the non-bonding region Ae is connected to the crack C1. That is, as shown in FIG. 4D, the crack C1 developing vertically downwards from the peripheral modification layer M1 up to the device layer D disappears, and the crack C2 developing obliquely upwards from the inner end of the non-bonding region Ae up to the crack C1 is formed over the entire circumference of the first wafer W1. In this way, since the crack C1 and the crack C2 are unified, a peeling cross section of the peripheral portion We can be stably formed.

Here, it is desirable that the crack C2 is connected to the lower end of the crack C1 as shown in FIG. 4D so that the crack C1 and the crack C2 are unified. However, the connection portion where the cracks C1 and C2 meet may not necessarily be the lower end of the crack C1. Specifically, if the lower end of the crack C1 is positioned above a peeling surface (more specifically, a ground surface to be described later) of the first wafer W1, the peripheral portion We may not be left at the first separation wafer Wd1 after being peeled (ground) even when the peeling is not stable when the peripheral portion We is removed. That is, by setting the lower end of the crack C1 to be located above the peeling surface (ground surface), the removal of the peripheral portion We and the thinning of the first wafer W1 can be appropriately performed even when the connection portion between the crack C1 and the crack C2 is not the lower end of the crack C1.

In addition, when a control is performed such that the crack C1 does not develop downwards from the peripheral modification layer M1 during the formation of the peripheral modification layer M1, or when the lower end of the crack C1 is located above the peeling surface to be described later, the crack C2 may be connected to the peripheral modification layer M1.

Furthermore, the crack C2 connecting the crack C1 to the inner end of the non-bonding region Ae is developed as the aforementioned internal stress is released due to an impact of the laser radiation during the formation of the peripheral modification layer M1, or an impact applied by a subsequent process of the wafer processing or a wafer transfer that follows.

Figure 1B:
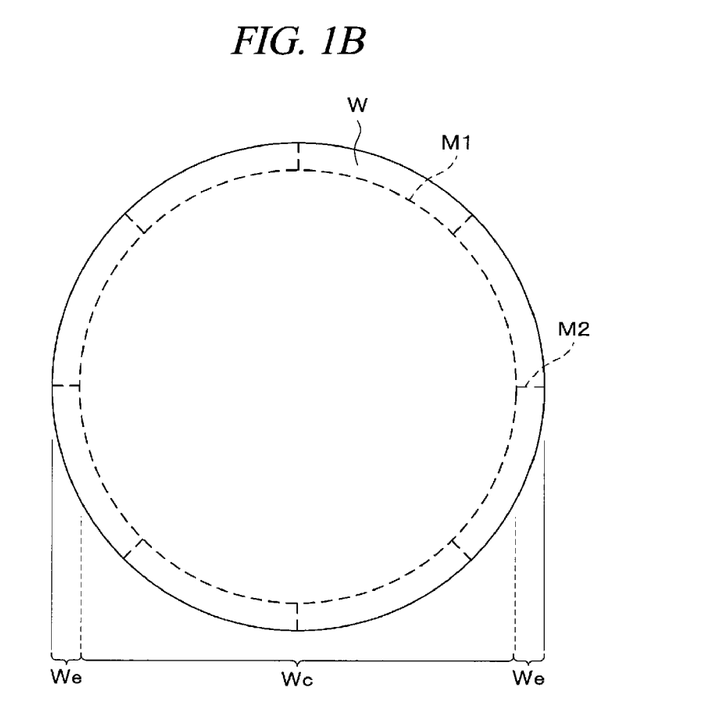

Once the peripheral modification layer M1 is formed, by moving the laser head (not shown), the split modification layer M2 which extends in the diametrical direction of the first wafer W1 is formed at a diametrically outer side than the peripheral modification layer M1. In addition, in the example of FIG. 1B and FIG. 4C, the split modification layer M2 is formed at eight locations in the circumferential direction of the first wafer W1 and three locations in the thickness direction of the first wafer W1. However, the number of the split modification layers M2 is not particularly limited but may be selected as required.

Next, as depicted in FIG. 5A, the internal modification layer M3 is formed inside the first wafer W1. In the formation of the internal modification layer M3, laser light is periodically radiated from the laser head (not shown) while rotating the combined wafer T (the first wafer W1), and, also, the laser head is relatively moved inwards in the diametrical direction of the first wafer W1. As a result, the internal modification layer M3 is formed within the first wafer W1 along the plane direction of the first wafer W1. Within the first wafer W1, a crack C3 develops from the internal modification layer M3 in the plane direction. The crack C3 develops only inside the peripheral modification layer M1 in the diametrical direction.

In addition, the lower end of the internal modification layer M3 to be formed is located above the front surface of the first separation wafer Wd1 after being separated and subjected to a final finishing processing. That is, the formation position of the internal modification layer M3 is adjusted such that the internal modification layer M3 is not left at the first separation wafer Wd1 after being ground.

After the internal modification layer M3 is formed inside the first wafer W1, the combined wafer T is then transferred from the internal modifying apparatus 61 to the periphery removing apparatus 62 by the wafer transfer device 70.

Figure 3:
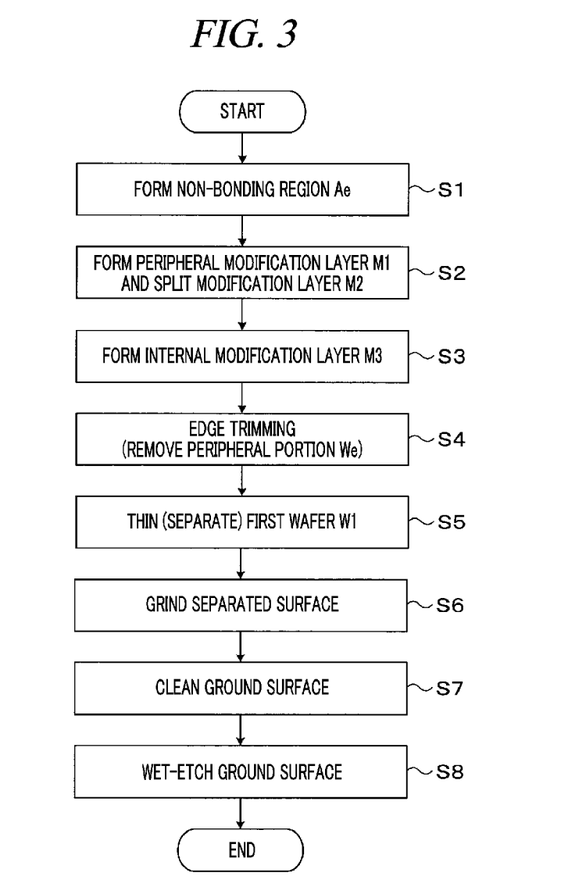
FIG. 3 is a flowchart illustrating an example of main processes of a wafer processing.

In the periphery removing apparatus 62, the peripheral portion We of the first wafer W1 is removed starting from the peripheral modification layer M1 (crack C1), the non-bonding region Ae, and the crack C2, as illustrated in FIG. 5B (process S4 of FIG. 3).

In the removal of the peripheral portion We, a blade as a wedge-shaped insertion member, for example, may be inserted into a bonding interface between the first wafer W1 and the second wafer W2 forming the combined wafer T. Accordingly, in the removal of the peripheral portion We, the peripheral portion We is appropriately peeled off starting from the peripheral modification layer M1 by an impact generated when the blade is inserted. In this case, even when the lower end of the crack C1 and the inner end of the non-bonding region Ae are not connected by the crack C2 during the formation of the above-described peripheral modification layer M1, the crack C2 can be developed appropriately by the impact at the time of the blade insertion so that the crack C1 and the non-bonding region Ae may be connected. At this time, since the crack C1 and the crack C2 are integrally formed inside the first wafer W1 and, further, the bonding strength for the second wafer W2 is reduced due to the presence of the non-bonding region Ae, the peripheral portion We is appropriately removed.

The combined wafer T from which the peripheral portion We of the first wafer W1 has been removed is then transferred from the periphery removing apparatus 62 to the processing apparatus 80 by the wafer transfer device 70. In the processing apparatus 80, the first wafer W1 is separated into the first separation wafer Wd1 and the second separation wafer Wd2 starting from the internal modification layer M3 (crack C3), as shown in FIG. 5C (process S5 of FIG. 3).

In the separation of the first wafer W1, the transfer arm 71 is raised in the state that the rear surface W1b of the first wafer W1 is attracted to and held by the transfer arm 71 and the rear surface W2b of the second wafer W2 is attracted to and held by the chuck 83. Accordingly, the first wafer W1 is separated into the first separation wafer Wd1 and the second separation wafer Wd2 starting from the internal modification layer M3, and the second separation wafer Wd2 is lifted upwards while being held by the transfer arm 71.

For example, the separated second separation wafer Wd2 is placed on the transfer position A0 and attracted to the attracting/holding surface of the transfer arm 71 by suctioning, and then collected to the outside of the wafer processing system 1. Further, as an example, a collector (not shown) may be provided within a movable range of the transfer arm 71, and the separated second separation wafer Wd2 may be collected by releasing the attraction of the second separation wafer Wd2 in the collector.

Furthermore, in the present exemplary embodiment, although the first wafer W1 is separated by raising the transfer arm 71, the transfer arm 71 may be raised after the second separation wafer Wd2 is cut along the internal modification layer M3 by rotating the transfer arm 71. Further, by measuring a pressure for suctioning the second separation wafer Wd2 with a pressure sensor (not shown) provided at the transfer arm 71, for example, presence or absence of the second separation wafer Wd2 may be detected, and, thus, it can be checked whether the first wafer W1 is separated.

Figure 5D:
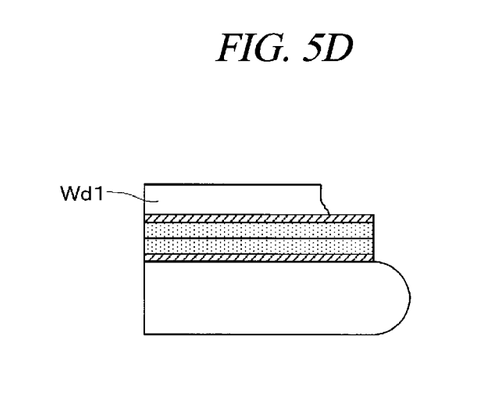

Next, the chuck 83 is moved to the processing position A1. Then, as shown in FIG. 5D, the separated surface of the separated combined wafer T, that is, the first separation wafer Wd1 held by the chuck 83 is ground by the grinding unit 84, and the internal modification layer M3 and the peripheral modification layer M1 remaining on this separated surface are removed (process S6 of FIG. 3). In the process S6, by respectively rotating the combined wafer T (first separation wafer Wd1) and the grinding whetstone while keeping the grinding whetstone in contact with the separated surface, the separated surface is ground. Further, the separated surface of the first separation wafer Wd1 may be then cleaned by a cleaning liquid, using a cleaning nozzle (not shown).

Subsequently, the combined wafer T is transferred to the cleaning apparatus 41 by the wafer transfer device 70. In the cleaning apparatus 41, the ground surface of the first separation wafer Wd1 is scrub-cleaned (process S7 of FIG. 3). Further, in the cleaning apparatus 41, the rear surface W2b of the second wafer W2 as well as the ground surface of the first separation wafer Wd1 may be cleaned.

Thereafter, the combined wafer T is transferred to the etching apparatus 40 by the wafer transfer device 50. In the etching apparatus 40, the ground surface of the first separation wafer Wd1 is wet-etched by a chemical liquid (process S8 of FIG. 3). A grinding mark may be formed on the ground surface ground by the aforementioned processing apparatus 80. In the process S8, the grinding mark can be removed by performing the wet-etching, so that the ground surface can be flattened.

Subsequently, the combined wafer T after being subjected to all the required processings is transferred to the transition device 30 by the wafer transfer device 50, and then transferred to the cassette Cw1 on the cassette placing table 10 by the wafer transfer device 20. Accordingly, a series of the processes of the wafer processing in the wafer processing system 1 is ended.

According to the above-described exemplary embodiment, the lower end of the crack C1 developing from the peripheral modification layer M1 is located at least above the non-bonding region Ae, and the inner end of the non-bonding region Ae is located at the outer side than the lower end of the crack C1 in the diametrical direction. Accordingly, the lower end of the crack C1 and the inner end of the non-bonding region Ae can be appropriately connected by the crack C2. Therefore, since the cracks C1 and C2 are suppressed from being developed together within the first wafer W1, the removal of the peripheral portion We can be stably performed over the entire circumference, that is, it can be suppressed that a part of the peripheral portion We as the removing target remains in the combined wafer T.

Further, since the peripheral portion We is suppressed from being left in the first separation wafer Wd1 in this way, chipping and particle generation in a subsequent process of the wafer processing are suppressed, so that damage on the combined wafer T and various kinds of processing apparatuses can be appropriately suppressed.

In addition, since the inner end of the non-bonding region Ae is located at the diametrically outer side than the lower end of the crack C1, the first wafer W1 can be suppressed from being put in a state where it is not firmly bonded to the second wafer W2 after the peripheral portion We is removed.

Further, it is desirable that the lower end of the peripheral modification layer M1 is located above the internal modification layer M3 and the non-bonding region Ae. In the present exemplary embodiment, by allowing the lower end of the crack C1 developing from the peripheral modification layer M1 to be located at least above the non-boning region Ae, the edge trimming can be carried out appropriately. Here, however, if the lower end of the peripheral modification layer M1 is located below the internal modification layer M3, the quality of the edge trimming may be deteriorated. As a specific example, the peripheral modification layer M1 may be left on the front surface or side surface of the separated first separation wafer Wd1 after the final finishing processing, causing the finished surface to become rough. From this point of view, in order to suppress the peripheral modification layer M1 from being left on the final finished surface of the first separation wafer Wd1, it is desirable that the lower end of the peripheral modification layer M1 is located above the internal modification layer M3.

In addition, in the above-described exemplary embodiment, after the non-bonding region Ae is formed at the interface between the first wafer W1 and the device layer D (process S1 of FIG. 3), the peripheral modification layer M1 is formed within the first wafer W1 (process S2 of FIG. 3). However, the sequence of the processes of the wafer processing is not limited thereto. By way of example, after the peripheral modification layer M1 is formed within the first wafer W1, the non-bonding region Ae may be formed at the diametrically outer side than the peripheral modification layer M1. In this case, the crack C2 connecting the crack C1 and the inner end of the non-bonding region Ae develops when the non-bonding region Ae is formed, for example.

Moreover, in the above-described exemplary embodiment, although the non-bonding region Ae is formed in the interface modifying apparatus 60 provided in the wafer processing system 1, the non-bonding region Ae may be formed at an outside of the wafer processing system 1. Furthermore, the non-bonding region Ae may be formed in the first wafer W1 before being bonded to the second wafer W2.

Figures 7A, 7B:
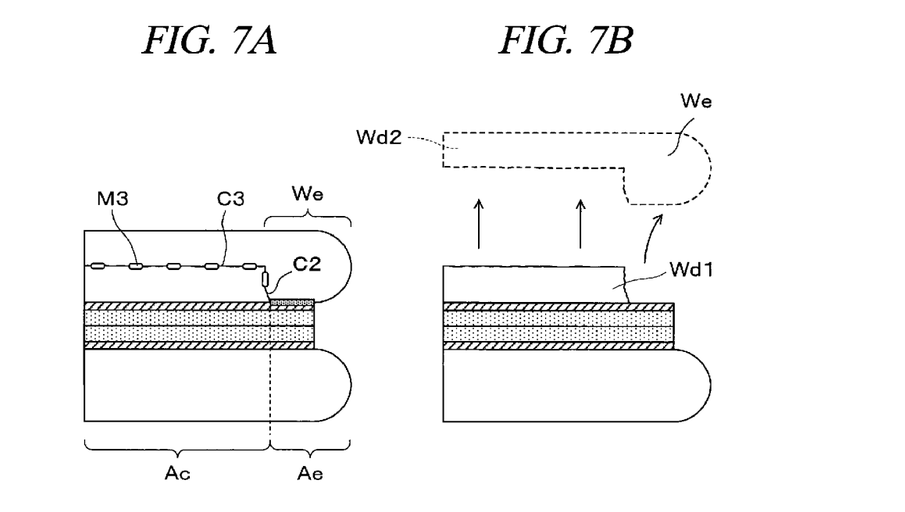
FIG. 7A and FIG. 7B are explanatory diagrams illustrating an example of another method of separating the first wafer.

Additionally, in the above-described exemplary embodiment, the crack C1 developing upwards from the peripheral modification layer M1 is made to reach the rear surface W1b of the first wafer W1. As shown in FIG. 7A, however, the crack C1 may not reach the rear surface W1b but may be connected to the crack C3 developing in the plane direction from the internal modification layer M3. In this case, in the separation of the first wafer W1, the second separation wafer Wd2 is separated as one body with the peripheral portion We, as illustrated in FIG. 7B. That is, the removal of the peripheral portion We and the separation of the first wafer W1 are performed at the same time. When the second separation wafer Wd2 and the peripheral portion We are separated as one body in this way, the split modification layer M2 does not need to be formed in the process S2 of FIG. 3 as described above.

Further, in the above-described exemplary embodiment, by forming the internal modification layer M3 within the first wafer W1, the first wafer W1 is separated (thinned) starting from this internal modification layer M3. However, how to thin the first wafer W1 is not limited thereto. By way of example, after the non-bonding region Ae, the peripheral modification layer M1 and the split modification layer M2 are formed in the combined wafer T, the peripheral portion We of the first wafer W1 may be removed, and, then, the first wafer W1 may be thinned by a grinding processing in the processing apparatus 80 as a grinder.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiment, it is possible to remove the peripheral portion of the first substrate in the combined substrate in which the substrates including the first substrate are bonded to each other.

We claim:

1. A substrate processing method of processing a combined substrate in which a first substrate and a second substrate are bonded to each other, the substrate processing method comprising:
    forming a peripheral modification layer along a boundary between a peripheral portion of the first substrate as a removing target and a central portion of the first substrate;
    forming a non-bonding region in which bonding strength between the first substrate and the second substrate in the peripheral portion is reduced; and
    removing the peripheral portion starting from the peripheral modification layer,
    wherein a first crack is developed from the peripheral modification layer toward the second substrate, and
    the peripheral modification layer is formed such that a lower end of the first crack is located above the non-bonding region and an inner end of the non-bonding region is located at a diametrically outward from the first crack.

2. The substrate processing method of claim 1, further comprising:
    forming multiple split modification layers extending in a diametrical direction of the first substrate by radiating laser light to an inside of the peripheral portion.

3. The substrate processing method of claim 1,
    wherein the non-bonding region is formed after the peripheral modification layer is formed, and
    when the non-bonding region is formed, the first crack and the inner end of the non-bonding region are connected by a second crack.

4. The substrate processing method of claim 3,
    wherein a connection portion where the first crack and the second crack are connected is the lower end of the first crack.

5. The substrate processing method of claim 3, further comprising:
    grinding a rear surface of the first substrate to thin the first substrate,
    wherein the peripheral modification layer is formed such that the lower end of the first crack is located above a ground surface of the first substrate after being ground, and
    the first crack and the second crack are connected at a position above the ground surface.

6. The substrate processing method of claim 1,
    wherein the peripheral modification layer is formed after the non-bonding region is formed, and
    when the peripheral modification layer is formed, the first crack and the inner end of the non-bonding region are connected by a second crack.

7. The substrate processing method of claim 1, further comprising:
    inserting an insertion member into an interface between the first substrate and the second substrate,
    wherein when the insertion member is inserted, the first crack and the inner end of the non-bonding region are connected by a second crack.

8. The substrate processing method of claim 1, further comprising:
    forming, along a plane direction of the first substrate, an internal modification layer serving as a starting point of separation of the first substrate.

9. The substrate processing method of claim 8,
    wherein the peripheral modification layer is formed such that a lower end of the peripheral modification layer is located above the internal modification layer.

10. The substrate processing method of claim 8,
    wherein the peripheral portion is removed as one body with a portion of the first substrate when the first substrate is separated.

11. A substrate processing system configured to process a combined substrate in which a first substrate and a second substrate are bonded to each other, the substrate processing system comprising:
    a first modifying unit configured to form a peripheral modification layer along a boundary between a peripheral portion of the first substrate as a removing target and a central portion of the first substrate;
    a second modifying unit configured to form a non-bonding region in which bonding strength between the first substrate and the second substrate in the peripheral portion is reduced;
    a removing unit configured to remove the peripheral portion starting from the peripheral modification layer; and
    a controller configured to control operations of the first modifying unit and the second modifying unit,
    wherein the controller controls the operations of the first modifying unit and the second modifying unit such that a lower end of a first crack developing from the peripheral modification layer toward the second substrate is located above the non-bonding region and such that an inner end of the non-bonding region is located at a diametrically outward from the first crack.

12. The substrate processing system of claim 11,
    wherein the controller controls an operation of the first modifying unit to radiate laser light to an inside of the peripheral portion to form multiple split modification layers extending in a diametrical direction of the first substrate.

13. The substrate processing system of claim 11, wherein the controller controls an operation of the second modifying unit such that the non-bonding region is formed after the peripheral modification layer is formed, and such that the lower end of the first crack and the inner end of the non-bonding region are connected by a second crack when the non-bonding region is formed.

14. The substrate processing system of claim 13, wherein the first crack and the second crack are connected at the lower end of the first crack.

15. The substrate processing system of claim 13, further comprising:
a grinder configured to grind a rear surface of the first substrate with a grinding whetstone to thin the first substrate,
wherein the first modifying unit forms the peripheral modification layer such that the lower end of the first crack is located above a ground surface of the first substrate after being ground, and
the first crack and the second crack are connected at a position above the ground surface.

16. The substrate processing system of claim 11, wherein the controller controls an operation of the first modifying unit such that the peripheral modification layer is formed after the non-bonding region is formed, and such that the lower end of the first crack and the inner end of the non-bonding region are connected by a second crack when the peripheral modification layer is formed.

17. The substrate processing system of claim 11, wherein the controller controls an operation of the removing unit such that an insertion member is inserted into an interface between the first substrate and the second substrate and the lower end of the first crack and the inner end of the non-bonding region are connected by a second crack when the insertion member is inserted.

18. The substrate processing system of claim 11, further comprising:
a third modifying unit configured to form an internal modification layer, which serves as a starting point of separation of the first substrate, along a plane direction of the first substrate.

19. The substrate processing system of claim 18, wherein the controller controls an operation of the third modifying unit such that a lower end of the peripheral modification layer is located above the internal modification layer.

20. The substrate processing system of claim 18, wherein the controller controls operations of the first modifying unit, the third modifying unit and the removing unit such that the peripheral portion is removed as one body with a portion of the first substrate when the first substrate is separated.

* * * * *